United States Patent
Li et al.

(10) Patent No.: US 10,210,916 B1
(45) Date of Patent: Feb. 19, 2019

(54) READING CIRCUITS AND METHODS

(71) Applicant: Shanghai Zhaoxin Semiconductor Co., Ltd., Shanghai (CN)

(72) Inventors: Wenxiao Li, Shanghai (CN); Jiesheng Chen, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/797,764

(22) Filed: Oct. 30, 2017

(30) Foreign Application Priority Data

Aug. 7, 2017 (CN) .......................... 2017 1 0667350

(51) Int. Cl.
*G11C 7/12* (2006.01)
*G11C 7/10* (2006.01)

(52) U.S. Cl.
CPC ............... *G11C 7/12* (2013.01); *G11C 7/106* (2013.01)

(58) Field of Classification Search
CPC ... G11C 7/067; G11C 11/404; G11C 11/4091; G11C 11/4094; G11C 2207/063; G11C 2207/104; G11C 2211/4016; G11C 13/004; G11C 13/0061; G11C 2013/0042; G11C 2013/0045
USPC ......... 365/189.15, 174, 189.09, 203, 189.07, 365/204, 233.17, 242, 189.05, 189.11
See application file for complete search history.

(56) References Cited

U.S. PATENT DOCUMENTS

| 5,204,560 | A | 4/1993 | Bredin et al. |
| 5,353,251 | A | 10/1994 | Uratani et al. |
| 5,671,181 | A * | 9/1997 | Hatsuda ................. G11C 7/062 365/189.05 |
| 2008/0159005 | A1 | 7/2008 | Lee et al. |
| 2012/0020149 | A1 | 1/2012 | Ito |

* cited by examiner

*Primary Examiner* — Thong Q Le
(74) *Attorney, Agent, or Firm* — McClure, Qualey & Rodack, LLP

(57) ABSTRACT

A reading circuit is provided in the invention. The reading circuit includes a pre-charger, a bit-line selecting circuit, and a latch circuit. The pre-charger receives a pre-charging control signal and the pre-charger is opened or closed according to the pre-charging control signal. The bit-line selecting circuit is coupled with the pre-charger at a node and selects a bit line for reading data according to a selecting signal. The latch circuit is coupled with the pre-charger at a node and outputs and latches the data of the bit line.

12 Claims, 5 Drawing Sheets

READING CIRCUITS AND METHODS

CROSS REFERENCE TO RELATED APPLICATIONS

This Application claims priority of China Patent Application No. 201710667350.7 filed on Aug. 7, 2017, the entirety of which is incorporated by reference herein.

BACKGROUND OF THE INVENTION

Field of the Invention

The invention generally relates to a bit-line-data reading technology, and more particularly, to a bit-line-data reading technology for increasing the reading speed of a modified reading circuit.

Description of the Related Art

As storage capacity increases, the storage array used in memory is composed of a plurality of rows of storage units. These storage units may share a reading circuit. In other words, there are a plurality of bit lines connected to a single reading circuit.

Four-stage delay units need to be configured in the traditional type of reading circuit discussed above. Therefore, the speed is slower. Furthermore, in order to avoid a float-point being generated in the reading circuit during the reading process, a feedback circuit is configured in the reading circuit to maintain the electric potential of the float-point. However, when reading data, the electric potential maintained by the feedback circuit needs to be canceled. Therefore, a transistor with a higher driving capability needs to be utilized to pull the feedback circuit against the keeper of the feedback circuit. Therefore, the reading circuit may use more power.

BRIEF SUMMARY OF THE INVENTION

A reading circuit and method realized by a pre-charging tube, a bit-line selector circuit and a latch circuit are provided to overcome the problems mentioned above.

An embodiment of the invention provides a reading circuit. The reading circuit comprises a pre-charging tube, a bit-line selector circuit and a latch circuit. The pre-charging tube receives a pre-charge control signal and the pre-charging tube is enabled or disabled according to the pre-charge control signal. The bit-line selector circuit is coupled to a node of the pre-charging tube and selects a bit line to read data according to a selection signal. The latch circuit is coupled to the pre-charging tube at the node and outputs and latches the data of the bit line.

In some embodiments, the bit-line selector circuit comprises a plurality of transfer gate circuits and each of the transfer gate circuits corresponds to one bit line. The bit-line selector circuit enables one of the transfer gate circuits according to the selection signal.

In some embodiments, when the pre-charge control signal is 0, the pre-charging tube is enabled and the latch circuit is in a latched state. When the pre-charge control signal is 1, the pre-charging tube is disabled and the latch circuit is in an enabled state.

An embodiment of the invention provides a reading method. The reading method is applied to a reading circuit. The reading method comprises the step of enabling a pre-charging tube of the reading circuit according to a pre-charge control signal to pre-charge a node; disabling the pre-charging tube and enabling a latch circuit of the reading circuit; selecting a bit line to read data according to a selection signal by a bit-line selector circuit; transmitting the data of the bit line to the latch circuit via the node; and outputting and latching the data of the bit line.

Other aspects and features of the invention will become apparent to those with ordinary skill in the art upon review of the following descriptions of specific embodiments of methods and devices.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
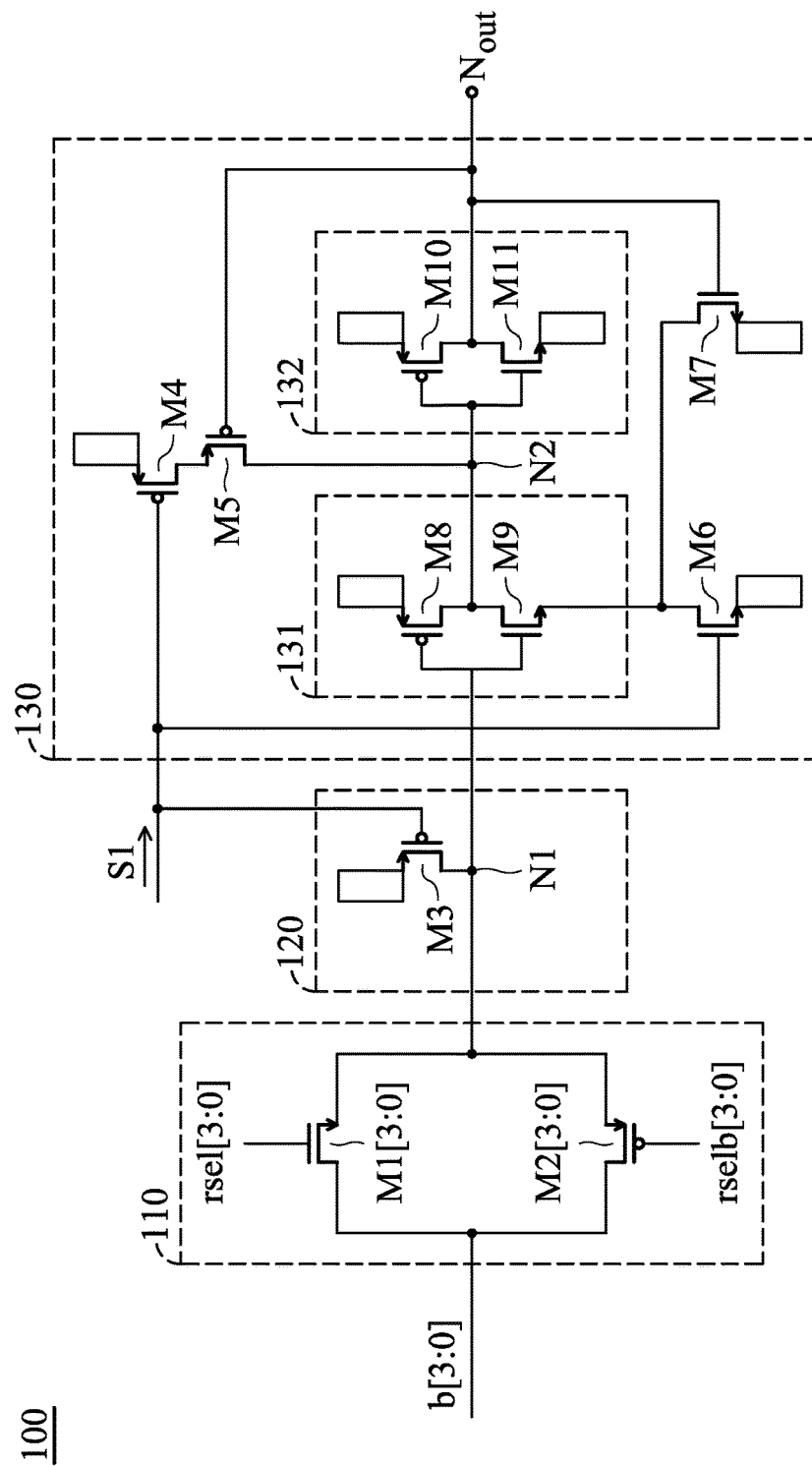
FIG. 1 is a block diagram of a mobile reading circuit 100 according to an embodiment of the invention.

FIG. 1 is a block diagram of a mobile reading circuit 100 according to an embodiment of the invention. The reading circuit 100 comprises a bit-line selector circuit 110, a pre-charging tube 120 and a latch circuit 130. Note that, in order to clarify the concept of the invention, FIG. 1 presents a simplified block diagram in which only the elements relevant to the invention are shown. However, the invention should not be limited to what is shown in FIG. 1.

In the embodiments of the invention, the latch circuit 120 may be a single-ended-output latch circuit. As shown in FIG. 1, the latch circuit 120 is a single-ended-output latch circuit, but the invention should not be limited thereto.

As shown in FIG. 1, the bit-line selector circuit 110 connects to four bit lines, b[0], b[1], b[2] and b[3], wherein the bit lines b[0], b[1], b[2] and b[3] are presented as b[3:0] in FIG. 1. Furthermore, the bit-line selector circuit 110 comprises four transfer gate circuits. Each of the transfer gate circuits corresponds to a bit line, and comprises a NMOS and a PMOS, wherein the NMOSs and PMOSs of the transfer gate circuits are presented as M1[3:0] and M2[3:0] in FIG. 1. The NMOS and PMOS of each transfer gate circuit respectively receive a selection signal and a reversed signal of the selection signal, wherein the selection signal and the reversed signal of the selection signal are presented as rsel[3:0] and rselb[3:0] in FIG. 1. A detailed description of the structure of the bit-line selector circuit 110 will be discussed in FIGS. 2A and 2B below. Furthermore, in FIG. 1, the bit-line selector circuit 110 comprises four transfer gate circuits, but the invention should not be limited thereto. A different number of transfer gate circuits are configured in the bit-line selector circuit 110 according to the number of connected bit lines.

Figure 2A:
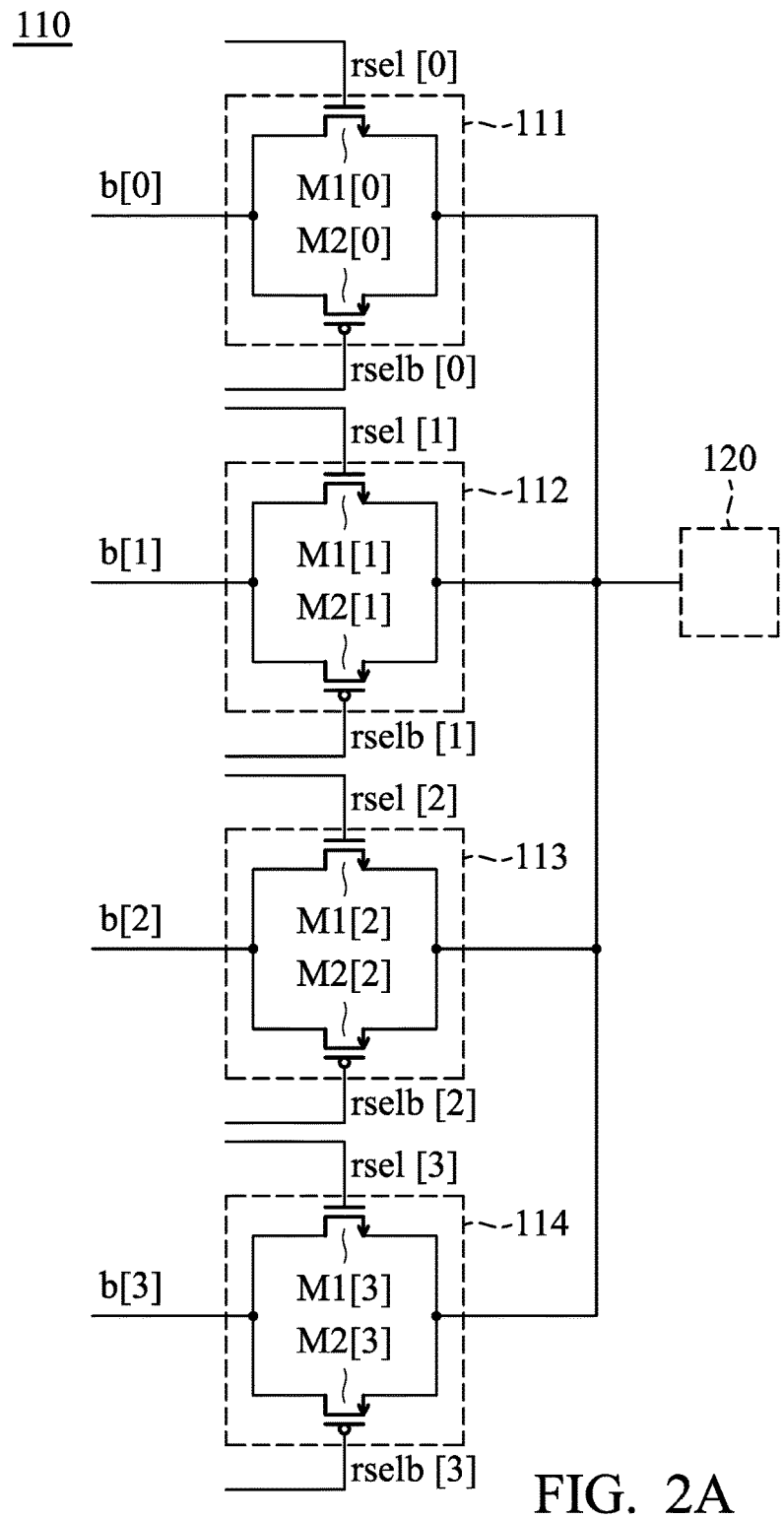
FIG. 2A is a circuit diagram of the bit-line selector circuit 110 according to an embodiment of the invention.

FIG. 2A is a circuit diagram of the bit-line selector circuit 110 according to an embodiment of the invention. As shown in FIG. 2A, the bit-line selector circuit 110 comprises four transfer gate circuits, a first transfer gate circuit 111, a second transfer gate circuit 112, a third transfer gate circuit 113 and a fourth transfer gate circuit 114. The first transfer gate circuit 111, the second transfer gate circuit 112, the third transfer gate circuit 113 and the fourth transfer gate circuit 114 respectively correspond to bit lines b[0], b[1], b[2] and b[3]. The first transfer gate circuit 111 comprises a first NMOS M1[0] and a first PMOS M2[0]. The second transfer gate circuit 112 comprises a second NMOS M1[1] and a second PMOS M2[1]. The third transfer gate circuit 113 comprises a third NMOS M1[2] and a third PMOS M2[2]. The fourth transfer gate circuit 114 comprises a fourth NMOS M1[3] and a fourth PMOS M2[3].

Figure 2B:
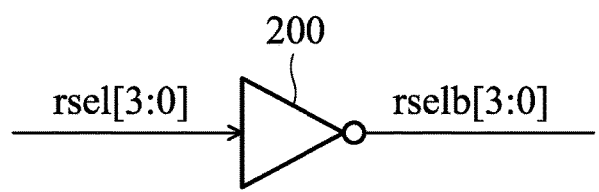
FIG. 2B is a circuit diagram of generating the reversed signal of the selection signal according to an embodiment of the invention.

FIG. 2B is a circuit diagram of generating the reversed signal of the selection signal according to an embodiment of the invention. In the embodiment of the invention, each transfer gate circuit of the bit-line selector circuit 110 further comprises an inverter 200. As shown in FIG. 2, after the selection signals rsel[3:0] are processed by the inverter 200, the reversed signals rselb[3:0] of the selection signals rsel[3:0] will be generated.

Back to FIG. 2A, the first NMOS M1[0] and the first PMOS M2[0] respectively receive the first selection signal rsel[0] and the first reversed signal rselb[0] of the first selection signal rsel[0]. The second NMOS M1[1] and the second PMOS M2[1] respectively receive the second selection signal rsel[1] and the second reversed signal rselb[1] of the second selection signal rsel[1]. The third NMOS M1[2] and the third PMOS M2[2] respectively receive the third selection signal rsel[2] and the third reversed signal rselb[2] of the third selection signal rsel[2]. The fourth NMOS M1[3] and the fourth PMOS M2[3] respectively receive the fourth selection signal rsel[3] and the fourth reversed signal rselb[3] of the fourth selection signal rsel[3].

In an embodiment of the invention, when the selection signal of a transfer gate circuit is 1 (i.e. rsel=1 and rselb=0), the NMOS and the PMOS of the transfer gate circuit will be enabled. When the NMOS and the PMOS of the transfer gate circuit are enabled, the transfer gate circuit will be enabled and the data of the bit line corresponding to the transfer gate circuit will be transmitted to the first node N1. Namely, when the selection signal of the transfer gate circuit is 1, it means that the bit line corresponding to the transfer gate circuit is selected. Furthermore, when a transfer gate circuit is enabled, other transfer gate circuits will be disabled. For example, when the bit line b[0] is selected, the value of the first selection signal rsel[0] will be changed from 0 to 1, and the values of other selection signals (second selection signal rsel[1], third selection signal rsel[2] and fourth selection signal rsel[3]) will maintain 0. Therefore, when the first transfer gate circuit 111 receives the first selection signal rsel[0] whose value is 1, the first transfer gate circuit 111 will be enabled, and the data of bit line b[0] will be transmitted to the first node N1, and other transfer gate circuits will be disabled.

Back to FIG. 1, the pre-charging tube 120 is coupled to the bit-line selector circuit 110 and the latch circuit 130 at the first node, and the pre-charging tube 120 is configured to receive the pre-charge control signal S1. The latch circuit 130 comprises a fifth PMOS M3. In an embodiment of the invention, when the pre-charge control signal S1 is 0, the fifth PMOS M3 will be enabled. When the pre-charge control signal S1 is 1 (or Vdd0), the fifth PMOS M3 will be disabled.

As shown in FIG. 1, the latch circuit 130 comprises a sixth PMOS M4, a seventh PMOS M5, a first inverter circuit 131, a second inverter circuit 132, a fifth NMOS M6 and a sixth NMOS M7. The first inverter circuit 131 comprises an eighth PMOS M8 and a seventh NMOS M9. The second inverter circuit 132 comprises a ninth PMOS M10 and an eighth NMOS M11.

In an embodiment of the invention, when the pre-charge control signal S1 is 0, the sixth PMOS M4 is enabled, and the fifth NMOS M6 is disabled. Therefore, the latch circuit 130 is in a latched state. When the pre-charge control signal S1 is 1 (or Vdd0), the sixth PMOS M4 is disabled, and the fifth NMOS M6 is enabled. Therefore, the latch circuit 130 is in an enabled state.

Figure 3:
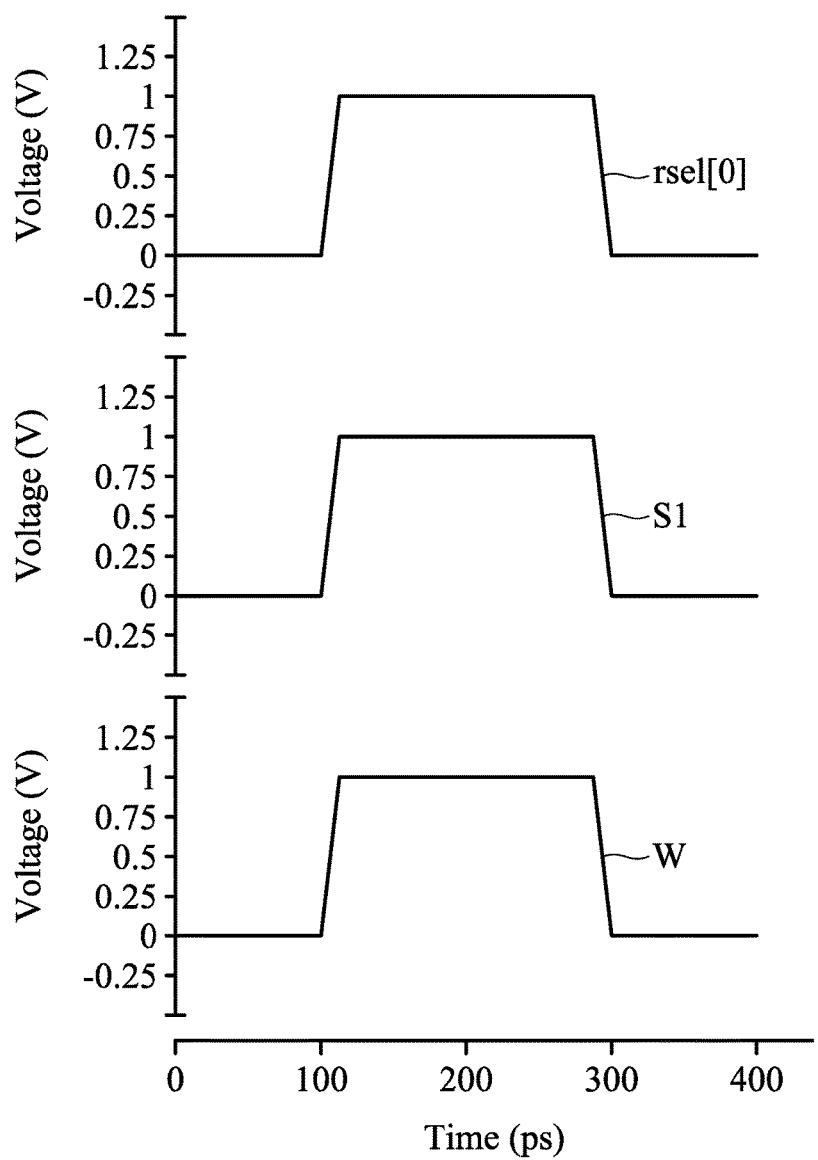
FIG. 3 is a waveform diagram 300 corresponding to a selection signal, a pre-charge control signal and a word line signal according to an embodiment of the invention.

FIG. 3 is a waveform diagram 300 corresponding to a selection signal, a pre-charge control signal and a word line signal according to an embodiment of the invention. The waveform diagram 300 shown in FIG. 3 can be applied to reading circuit 100. The reading circuit 100 will be taken to illustrate the waveform diagram 300 of FIG. 3 below. The word line signal W of FIG. 3 means the word line of the storage device (not shown in figures). When the word line signal W is high electric potential, it means that the data of the memory unit of the storage device will be read.

As shown in FIG. 3, the period of the reading circuit 100 reading the data from the storage device may be divided into three stages, the initial stage, a reading stage and a latch stage.

In the initial stage (0~100 ps), the word line signal W, selection signals rsel[3:0] and the pre-charge control signal S1 are 0, and all bit lines are pre-charged to source voltage Vdd0. When the pre-charge control signal S1 is 0, the fifth PMOS M3 and the sixth PMOS M4 will be enabled and the fifth NMOS M6 will be disabled. When the fifth PMOS M3 is enabled (i.e. the pre-charging tube 120 is in the enabled state), the first node N1 is charged to source voltage Vdd0. When the sixth PMOS M4 is enabled and the fifth NMOS M6 is disabled, the latch circuit 130 is in the latched state. Furthermore, because the selection signals rsel[3:0] are 0 (i.e. the first selection signal rsel[0], the second selection signal rsel[1], the third selection signal rsel[2] and the fourth selection signal rsel[3]), all the transfer gate circuits are disabled. Therefore, the path between the bit lines b[3:0] (i.e. bit line b[0], b[1], b[2] and b[3]) and the first node N1 will be disconnected. When the initial stage has expired, the reading stage will be entered.

In the reading stage, the word line signal W and the pre-charge control signal S1 are changed to 1 (or Vdd0). When the pre-charge control signal S1 is 1, the fifth PMOS M3 and sixth PMOS M4 will be disabled, and the fifth NMOS M6 will be enabled. When the sixth PMOS M4 is disabled and the fifth NMOS M6 is enabled, the latch circuit is in the enabled state. According to the embodiment of the invention, if the bit line b[0] is selected in the reading stage, the value of the first selection signal rsel[0] will be changed from 0 to 1, and the values of other selection signals rsel[3:1] (i.e. the second selection signal rsel[1], the third selection signal rsel[2] and the fourth selection signal rsel[3]) may be maintained 0. When the first selection signal rsel[0] is 1, the first transfer gate circuit 111 is enabled and the data of bit line b[0] is transmitted to the first node N1. For example, if the data of bit line b[0] is 0, the value of the first node N1 will be changed from 1 (or Vdd0) to 0; and if the data of bit line b[0] is 1, the value of the first node N1 will be maintained 1 (or Vdd0). Then, the data of the bit line b[0] may be transmitted to the latch circuit 130 through the first node N13 and the latch circuit 130 may transmit the data of the bit line b[0] to an output node $N_{out}$. Specifically, the value of the first node N1 is transmitted to the first inverter 131 first, and a reversed signal is generated in the second node N2. Then, the value of the second node N2 is transmitted to the second inverter 132 and the second inverter 132 may reverse the value of the second node N2 and transmit the reversed value of the second node N2 to the output node $N_{out}$. When the reading stage has expired, the latch stage will be entered.

In the latch stage, when the data is outputted (read) from the output node $N_{out}$ the word line signal W, selection signal rsel[0] and the pre-charge control signal S1 will change to 0 again. Therefore, the bit-line selector circuit 100 will be disabled (i.e. all the transfer gate circuits are in the disable state), and the path between the bit lines b[3:0] and the first node N1 will be disconnected. Furthermore, when the pre-charge control signal S1 is changed to 0, the fifth PMOS M3 and the sixth PMOS M4 will be enabled and the fifth NMOS M6 will be disabled. When the fifth PMOS M3 is enabled (i.e. the pre-charging tube 120 is in the enabled state), the first node will be re-charged to the source voltage Vdd0. When the sixth PMOS M4 is enabled and the fifth NMOS M6 is disabled, the latch circuit is in the latched state and the outputted (read) data will be latched. Then, the reading circuit 100 returns to its initial stage and waits for the next period of the reading operation.

Figure 4:
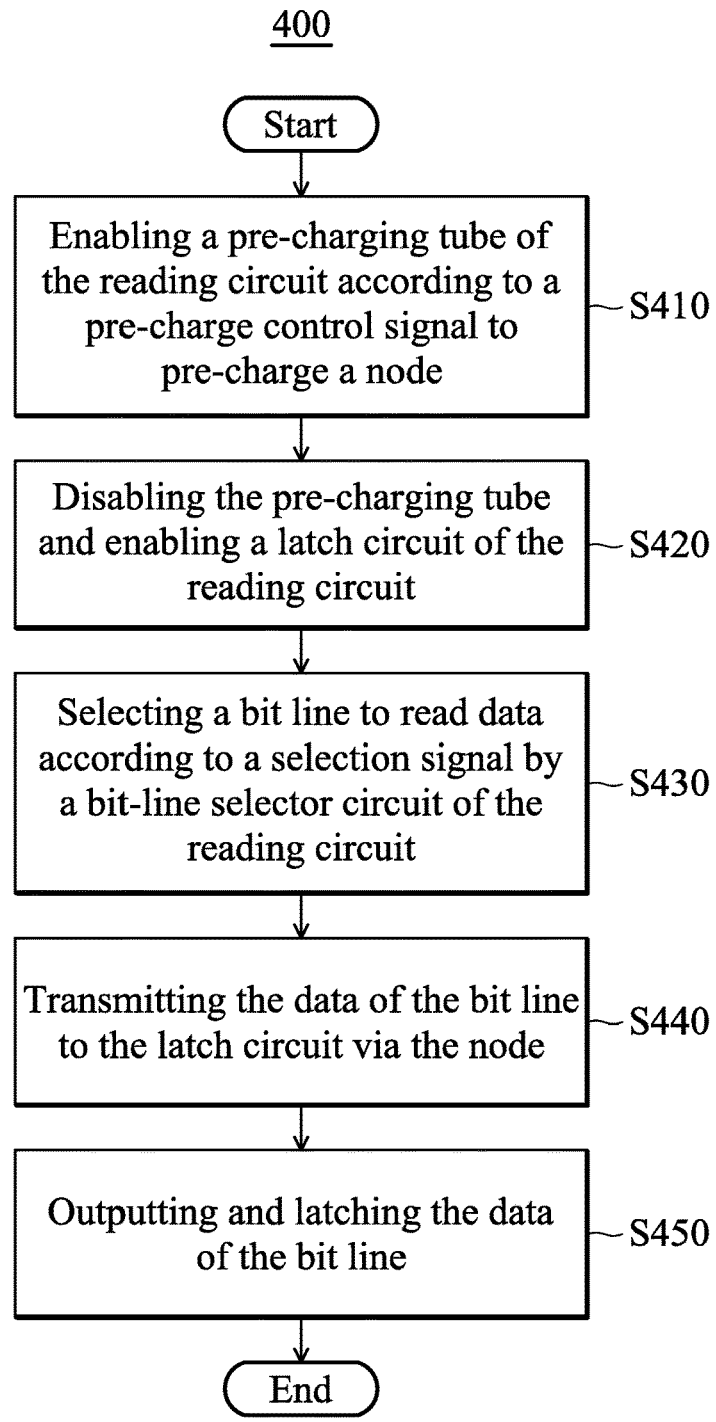
FIG. 4 is a flow chart 400 illustrating the reading method according to an embodiment of the invention.

FIG. 4 is a flow chart 400 illustrating the reading method according to an embodiment of the invention. The reading method of the flow chart 400 can be applied to the reading circuit 100. In step S410, the reading circuit 100 enables a pre-charging tube according to a pre-charge control signal to pre-charge a node. In step S420, the reading circuit 100 disables the pre-charging tube and enables a latch circuit. In step S430, a bit line is selected according to a selection signal by a bit-line selector circuit of the reading circuit 100 to read the data. In step S440, the reading circuit 100 transmits the data of the bit line to the latch circuit via the node. In step S450, the latch circuit of the reading circuit 100 outputs and latches the data of the bit line.

In an embodiment of the invention, when the pre-charge control signal is 0, the reading method further comprises the steps of enabling the pre-charging tube and putting the latch circuit in a latched state. When the pre-charge control signal is 1, the reading method further comprises the steps of disabling the pre-charging tube and putting the latch circuit in an enabled state.

According to the reading circuit and method provided in the invention, in the reading circuit, from the bit lines to the output node, only three-stage delay units (the first inverter circuit 131, the second inverter circuit 132 and the inverter 200) need to be configured, as a result, the reading circuit has a faster reading speed. Furthermore, unlike a traditional reading circuit, the feedback circuit in the structure of the reading circuit of the invention does not need to be configured for the floating node. Therefore, the space of the reading circuit will be saved and the power consumption of the reading circuit will be reduced.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A reading circuit, comprising:
   a pre-charging tube, receiving a pre-charge control signal, wherein the pre-charging tube is enabled or disabled according to the pre-charge control signal;
   a bit-line selector circuit, coupled to a node of the pre-charging tube and selecting a bit line to read data according to a selection signal; and
   a latch circuit, coupled to the pre-charging tube at the node and outputting and latching the data of the bit line, wherein the latch circuit receives the pre-charge control signal and the latch circuit is in a latched state or in an enabled state according to the pre-charge control signal.

2. The reading circuit of claim 1, wherein the bit-line selector circuit comprises a plurality of transfer gate circuits and each of the transfer gate circuits corresponds to one bit line.

3. The reading circuit of claim 2, wherein the bit-line selector circuit enables one of the transfer gate circuits according to the selection signal.

4. The reading circuit of claim 1, wherein the latch circuit is a single-ended-output latch circuit.

5. The reading circuit of claim 1, wherein when the pre-charge control signal is 0, the pre-charging tube is enabled and the latch circuit is in the latched state.

6. The reading circuit of claim 5, wherein when the pre-charge control signal is 1, the pre-charging tube is disabled and the latch circuit is in the enabled state.

7. A reading method, applied to a reading circuit, comprising:
   enabling a pre-charging tube of the reading circuit according to a pre-charge control signal to pre-charge a node and putting a latch circuit of the reading circuit in a latched state according to the pre-charge control signal;
   disabling the pre-charging tube and putting the latch circuit in an enabled state;
   selecting, by a bit-line selector circuit of the reading circuit, a bit line to read data according to a selection signal;
   transmitting the data of the bit line to the latch circuit via the node; and
   outputting and latching the data of the bit line.

8. The reading method of claim 7, wherein the bit-line selector circuit comprises a plurality of transfer gate circuits and each of the transfer gate circuits corresponds to one bit line.

9. The reading method of claim 8, further comprising:
enabling, using the bit-line selector circuit, one of the transfer gate circuits according to the selection signal.

10. The reading method of claim 7, wherein the latch circuit is a single-ended-output latch circuit.

11. The reading method of claim 7, further comprising:
when the pre-charge control signal is 0, enabling the pre-charging tube and putting the latch circuit in the latched state.

12. The reading method of claim 7, further comprising:
when the pre-charge control signal is 1, disabling the pre-charging tube and putting the latch circuit in the enabled state.

\* \* \* \* \*